Nov. 8, 1960 R. EZAKI 2,959,719

SEMICONDUCTOR DEVICE

Filed May 8, 1958

Inventor
Reona Ezaki
by Hill, Sherman, Meroni, Gross & Simpson Attys

United States Patent Office 2,959,719

Patented Nov. 8, 1960

2,959,719

SEMICONDUCTOR DEVICE

Reona Ezaki, Tokyo, Japan, assignor to Sony Corporation, a corporation of Japan

Filed May 8, 1958, Ser. No. 733,976

Claims priority, application Japan June 29, 1957

4 Claims. (Cl. 317—235)

This invention relates to a semiconductor device and more particularly to a transistor having comparatively small base spreading resistance.

It has been well known that every transistor has the base spreading resistance $R_{bs}$ of a certain order. The base resistance $R_{bs}$ is, however, a passive element which takes no part in the amplification of the transistor.

It is one of necessary conditions for obtaining a transistor of high qualities to possibly minimize the base spreading resistance.

Especially, the base spreading resistance $R_{bs}$ of a transistor for high frequency use is apt to increase because of the fact that the base width of such a transistor is to be made as small as possible.

It is a principal object of this invention to provide a semiconductor device or a transistor having a comparatively small value of the base spreading resistance $R_{bs}$ even in the case of having comparatively small base width.

It is another object of this invention to provide a semiconductor device which can be easily assembled owing to its compact construction.

In accordance with this invention, the above mentioned object can be attained by making a p-n-p or a n-p-n junction on the surface of a p-n junction piece which is made as a grown type p-n junction, the p-n-p or n-p-n junction being formed by a double diffusion method or a combined diffusion and alloying method as well understood by those skilled in the art.

In order to reduce the collector capacitance, it is preferable to use a graded p-n junction as a junction piece.

Other objects, features and advantages of the present invention will be more fully apparent from the following detailed description taken in connection with the accompanying drawings, in which.

Figure 1:
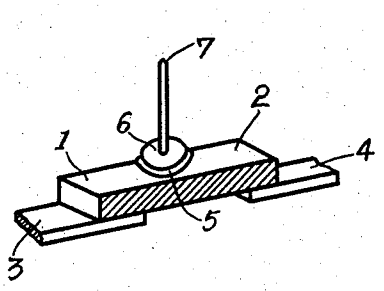
Fig. 1 is an enlarged and schematic perspective view of a semiconductor device embodying this invention.
Figure 2:
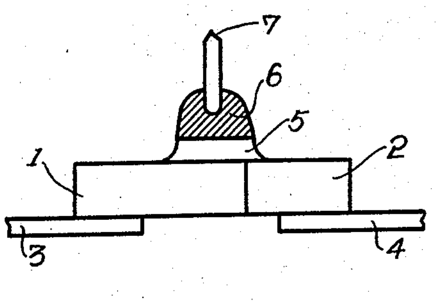
Fig. 2 is an explanatory side view of the semiconductor device shown in Fig. 1.

Referring to the drawings 1 and 2 designate respectively a p-region and a n-region of a transistor, which form the different regions of a grown type p-n junction. These regions have metallic electrodes 3 and 4 which are respectively attached thereto.

A region 5 is a thin n-region made by diffusion and is formed as a base layer and the greater part thereof spreads over the region 1 to form a p-n junction therebetween and the other part of the region 5 spreads over the region 2.

Over the region 5 is provided a p-type region 6 which forms a p-n junction with the region 5.

The region 6 has a lead wire 7 attached to the other end thereof.

Thus the electrodes 3, 4 and 7 form respectively an emitter, base and collector, or respectively a collector, base and emitter.

The above description is mainly made in connection with a p-n-p type transistor, by way of example, but it will be easily understood that a n-p-n type transistor may be made by substituting the n-region for the p-region above referred to.

Experimental measurements show that the base spreading resistance $R_{bs}$ of an ordinary grown type transistor is usually about 200Ω or more, while that of a transistor according to this invention is 100Ω and less than this value in the case of having substantially the same base width as in the ordinary transistor.

While I have explained a particular embodiment of my invention, it will be understood, of course, that I do not wish to be limited thereto since many modifications may be made and I, therefore, contemplate by the appended claims to cover any such modifications as within the spirit and scope of my invention.

What is claimed is:

1. A signal translating semiconductor device consisting of, a body of semiconductor material having a first region of one conductivity type, and a second region of an opposite conductivity type, said first and second regions having one common interface defined by a p-n junction of the grown type, a third region of said same one conductivity type, said third region being formed by diffusing semiconductor material onto a surface of the semiconductor material of said first and second regions, said third region having a common interface with both said first and second regions, and a fourth region of said opposite conductivity type, said fourth region having a common interface only with said third region and forming a p-n junction therewith at said interface, and electrode means contacting said first, second and fourth regions respectively.

2. A signal translating semiconductor device consisting of, a grown type p-n junction between first and second regions of semiconductor material of opposite conductivity types, said junction being defined by a first interface between said regions in a first plane, a third region of semiconductor material diffused onto adjacent continuous surfaces of said first and second regions, said third region having a continuous interface with both said first and second regions, said continuous interface lying in a second plane intersecting the first plane of said first interface at a predetermined angle, and a fourth region of a semiconductor material having a conductivity type opposite to that of said third region, said fourth region having a common interface only with said third region defined by a p-n junction between said third and fourth regions, and electrode means contacting said first, second and fourth regions respectively.

3. A transistor consisting of a semiconductor crystal having a grown junction extending thereacross providing emitter and base regions, each having an electrode connected thereto and a collector region consisting of an inner and an outer layer on the side of said crystal forming a graded junction extending transverse to, intersecting, and connected to both sides of, said grown junction with its said inner layer being of the same conductivity type as said base region and its said outer layer being of the same conductivity type as said emitter region and having an electrode connected thereto to provide a low base spreading resistance.

4. A low base resistance transistor consisting only of a semiconductor crystal having a first junction therein providing emitter and base regions each having an electrode connected thereto, and an inner and an outer layer having a second and graded junction therebetween on one side of said crystal and extending across said junction and connected to said emitter and base regions with its said outer layer being of the same conductivity type as said emitter region and having a collector electrode connected thereto.

References Cited in the file of this patent

UNITED STATES PATENTS 2,770,761 Pfann ............... Nov. 13, 1956